(12) United States Patent
Hirayama

(10) Patent No.: US 12,731,761 B2
(45) Date of Patent: Sep. 8, 2026

(54) PLASMA PROCESSING APPARATUS

(71) Applicant: Tokyo Electron Limited, Tokyo (JP)

(72) Inventor: Masaki Hirayama, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 434 days.

(21) Appl. No.: 18/241,468

(22) Filed: Sep. 1, 2023

(65) Prior Publication Data

US 2024/0087849 A1 Mar. 14, 2024

(30) Foreign Application Priority Data

Sep. 9, 2022 (JP) ................................ 2022-143542

(51) Int. Cl.
*H01J 37/32* (2006.01)

(52) U.S. Cl.
CPC .. *H01J 37/32165* (2013.01); *H01J 37/32568* (2013.01); *H01J 2237/002* (2013.01)

(58) Field of Classification Search
CPC ........... H01J 37/32165; H01J 37/32568; H01J 2237/002
USPC ..................................................... 156/345.48
See application file for complete search history.

(56) References Cited

U.S. PATENT DOCUMENTS

2013/0098873 A1* 4/2013 Ramaswamy .... H01J 37/32541 156/345.38
2017/0137944 A1* 5/2017 Kubota ................ C23C 16/511

FOREIGN PATENT DOCUMENTS

JP 10-255998 A 9/1998
JP 2000012292 A * 1/2000 .......... C23C 16/511
JP 2003077699 A * 3/2003
JP 2020-092031 A 6/2020
KR 1020210091333 A 7/2021

* cited by examiner

*Primary Examiner* — Parviz Hassanzadeh
(74) *Attorney, Agent, or Firm* — Nath, Goldberg & Meyer; Jerald L. Meyer; Tanya E. Harkins

(57) ABSTRACT

A plasma processing apparatus includes: a chamber providing a processing space; a substrate support provided inside the processing space; a first electrode provided above the processing space; a second electrode provided above the processing space and below the first electrode, the second electrode providing a plasma generation space between the first electrode and the second electrode and providing a plurality of through-holes to guide active species generated in the plasma generation space into the processing space; an introducer made of a dielectric material and configured to introduce electromagnetic waves into the plasma generation space; and a resonator including a waveguide for propagation of the electromagnetic waves to the introducer, wherein the waveguide has a length longer than ½ of a wavelength of the electromagnetic waves in the waveguide.

18 Claims, 6 Drawing Sheets

AX
42
42a
42b
40
41
43
44
46
45
52
52
52
50
201s
201a
201h
201
201b 40
43
41
42
42a
42b
50
50
52
52
52
52
52
201a
201s
201h
201s

1B
AX
36
30
40
34
20B
201a
24d
14h
24
14
15
18
16
16h
W
12
10s
10e
20a
201B
203B
202B
20b
10
10a
20w

1D
AX
201a
60i
62
60
61
61
62
60i
20B
20a
201B
203B
202B
60h
20b
10
10a
20w
24d
14h
24
14
15
18
16
16h
W
12
10s
10e

PLASMA PROCESSING APPARATUS

CROSS-REFERENCE TO RELATED APPLICATION

This application is based upon and claims the benefit of priority from Japanese Patent Application No. 2022-143542, filed on Sep. 9, 2022, the entire contents of which are incorporated herein by reference.

TECHNICAL FIELD

Exemplary embodiments of the present disclosure relate to a plasma processing apparatus.

BACKGROUND

A plasma processing apparatus is used for a plasma processing on a substrate. One type of plasma processing apparatus includes a processing container, a stage, an upper electrode, an introducer, and a waveguide structure. The stage is provided inside the processing container. The upper electrode is provided above the stage via an internal space of the processing container. The introducer is a radio-frequency introducer and is provided at a lateral end portion of the internal space of the processing container to extend circumferentially around a central axis of the processing container. The waveguide structure is configured to supply a radio frequency to the introducer. The waveguide structure includes a resonator that provides a waveguide. The waveguide of the resonator extends circumferentially around the central axis and extends in a direction in which the central axis extends, thus being connected to the introducer.

PRIOR ART DOCUMENT

Patent Document

Patent Document 1: Japanese Laid-Open Patent Publication No. 2020-092031

SUMMARY

According to one embodiment of the present disclosure, there is provided a plasma processing apparatus including: a chamber providing a processing space; a substrate support provided inside the processing space; a first electrode provided above the processing space; a second electrode provided above the processing space and below the first electrode, the second electrode providing a plasma generation space between the first electrode and the second electrode and providing a plurality of through-holes to guide active species generated in the plasma generation space into the processing space; an introducer made of a dielectric material and configured to introduce electromagnetic waves into the plasma generation space; and a resonator including a waveguide for propagation of the electromagnetic waves to the introducer, wherein the waveguide has a length longer than ½ of a wavelength of the electromagnetic waves in the waveguide.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Figure 1:
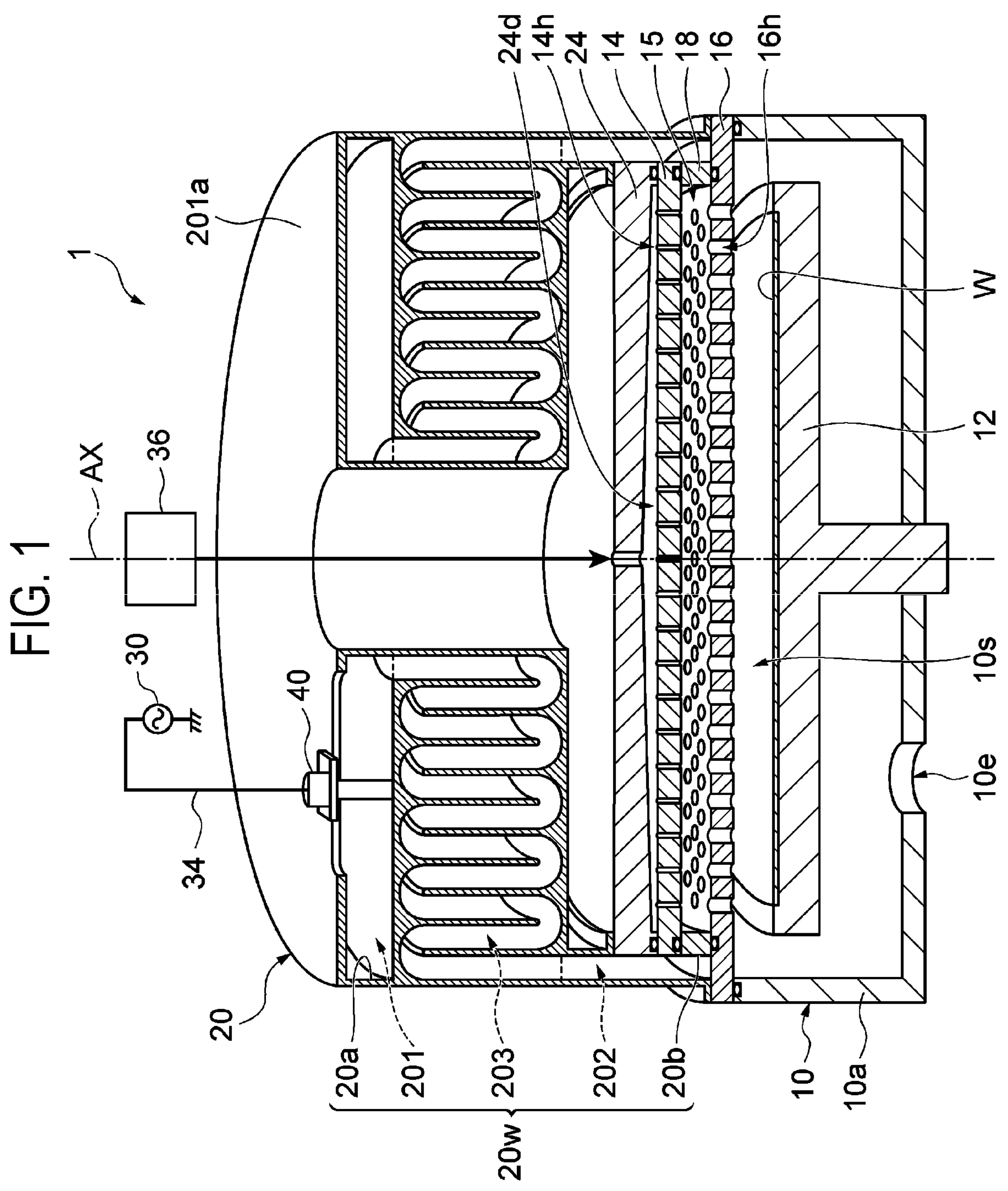
FIG. 1 is a view illustrating a plasma processing apparatus according to one exemplary embodiment.

Hereinafter, various exemplary embodiments will be described in detail with reference to the drawings. In addition, the same reference numerals will be given to the same or corresponding parts in each drawing. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a view illustrating a plasma processing apparatus according to one exemplary embodiment. A plasma processing apparatus 1 illustrated in FIG. 1 includes a chamber 10, a substrate support 12, a first electrode 14, a second electrode 16, an introducer 18, and a resonator 20.

The chamber 10 includes a processing space 10*s* provided therein. In the plasma processing apparatus 1, a substrate W is processed inside the processing space 10*s*. The chamber 10 is made of a metal such as aluminum and is grounded. The chamber 10 has a sidewall 10*a* and is open at the top thereof. The chamber 10 and the sidewall 10*a* may have a substantially cylindrical shape. The processing space 10*s* is provided inward of the sidewall 10*a*. A central axis of each of the chamber 10, the sidewall 10*a*, and the processing space 10*s* is an axis AX. The chamber 10 may have a corrosion-resistant film on a surface thereof. The corrosion-resistant film may be an yttrium oxide film, an yttrium fluoride oxide film, an yttrium fluoride film, or a ceramic film containing a material such as an yttrium oxide or an yttrium fluoride.

A bottom portion of the chamber 10 provides an exhaust port 10*e*. The exhaust port 10*e* is connected to an exhaust device. The exhaust device may include a vacuum pump such as a dry pump and/or a turbo molecular pump, and an automatic pressure control valve.

The substrate support 12 is provided in the processing space 10*s*. The substrate support 12 is configured to substantially horizontally support the substrate W placed on an upper surface of the substrate support 12. The substrate support 12 has a substantially disk shape. A central axis of the substrate support 12 is the axis AX.

The first electrode 14 is provided above the processing space 10*s*. The first electrode 14 is made of a conductor such as aluminum and has a substantially disk shape. The central axis of the first electrode 14 is the axis AX. The first electrode 14 may provide a plurality of gas holes 14*h* for introducing a gas into a plasma generation space 15 to be described later. The plurality of gas holes 14*h* extend in the thickness direction (vertical direction) of the first electrode 14 and pass through the first electrode 14.

The second electrode 16 is provided above the processing space 10*s* and below the first electrode 14. The second electrode 16 may extend substantially parallel to the first electrode 14. The second electrode 16 is made of a conductor such as aluminum and has a substantially disk shape. The central axis of the second electrode 16 is the axis AX. The second electrode 16 closes a top opening of the chamber 10. That is, the second electrode 16 partitions the processing space 10*s* from above.

The second electrode 16 provides the plasma generation space 15 between the first electrode 14 and the second electrode 16. In the plasma generation space 15, plasma is generated from the gas by electromagnetic waves. The second electrode 16 is provided with a plurality of through-holes 16*h* in order to guide active species from the plasma inside the plasma generation space 15 to the processing space 10*s*. The plurality of through-holes 16*h* extend in the thickness direction (vertical direction) of the second electrode 16 and pass through the second electrode 16. A cross-sectional area of the plurality of through-holes 16*h* is set so as to prevent the active species from being deactivated when passing through the plurality of through-holes 16*h*, and is relatively large.

The introducer 18 is configured to introduce electromagnetic waves into the plasma generation space 15 in order to generate the plasma in the plasma generation space 15. The introducer 18 is made of a dielectric material such as quartz, an aluminum nitride, or an aluminum oxide. The introducer 18 may extend circumferentially around the axis AX so as to surround the plasma generation space 15. The introducer 18 may have a ring shape. The introducer 18 may be sandwiched between a periphery of the first electrode 14 and a periphery of the second electrode 16. The electromagnetic waves, introduced into the plasma generation space 15 from the introducer 18, may be radio-frequency waves such as VHF waves or UHF waves. The electromagnetic waves are generated by a radio-frequency power supply to be described later. The electromagnetic waves propagate to the introducer 18 via the resonator 20, thus being introduced into the plasma generation space 15 from the introducer 18. Details of the resonator 20 will be described later.

In one embodiment, the plasma processing apparatus 1 may further include a lid 24. The lid 24 is provided on the first electrode 14. The lid 24 is made of a conductor such as aluminum and has a substantially disk shape. A central axis of the lid 24 is the axis AX.

The lid 24 provides a gas diffusion space 24*d* between the first electrode 14 and the lid 24. A gas supplier 36 is connected to the gas diffusion space 24*d*. A gas output from the gas supplier 36 is supplied to the plasma generation space 15 via the gas diffusion space 24*d* and the plurality of gas holes 14*h*.

The plasma processing apparatus 1 may further include a radio-frequency power supply 30. The radio-frequency power supply 30 is electrically coupled to the waveguide of the resonator 20 and is configured to generate radio-frequency power having a variable frequency. The electromagnetic waves introduced into the chamber 10 are generated based on the radio-frequency power generated by the radio-frequency power supply 30. The radio-frequency power supply 30 may be directly connected to the waveguide of the resonator 20 using a coaxial line 34. That is, the radio-frequency power supply 30 may be coupled to the waveguide of the resonator 20 without passing through a matcher.

The resonator 20 may be provided above the chamber 10. The resonator 20 includes a waveguide 20*w* for propagating the electromagnetic waves to the introducer 18. The waveguide 20*w* may provide a cavity surrounded by a wall made of a conductor such as aluminum. The waveguide 20*w* includes a first end 20*a* and a second end 20*b*. The second end 20*b* is an end of a second portion 202 of the waveguide 20*w* to be described later and is coupled to the introducer 18. The first end 20*a* is an end of the waveguide 20*w* opposite to the second end 20*b*. A length (electrical length) of the waveguide 20*w* of the resonator 20, that is, a length between the first end 20*a* and the second end 20*b* of a path along which the electromagnetic waves propagate inside the waveguide 20*w* is longer than ½ of the wavelength of the electromagnetic waves in the waveguide 20*w*. The length of the waveguide 20*w* of the resonator 20 may be ¾ or less of the wavelength of the electromagnetic waves in the waveguide 20*w*.

In one embodiment, the waveguide 20*w* may include a first portion 201, the second portion 202, and a third portion 203. In FIG. 1, a boundary between the first portion 201 and the third portion 203 and a boundary between the second portion 202 and the third portion 203 are indicated by dotted lines.

The first portion 201 is coupled to a connector 40 to be described later in order to introduce the electromagnetic waves into the waveguide 20*w*. The connector 40 is a portion of the coaxial line 34. The first portion 201 includes the first end 20*a*. The first portion 201 may have a cylindrical shape, and a central axis thereof may be the axis AX. That is, the first portion 201 may extend horizontally from the first end 20*a* so as to approach the axis AX.

The second portion 202 includes the second end 20*b* described above and is coupled to the introducer 18. The second portion 202 extends downward to the second end 20*b*. The second portion 202 may have a cylindrical shape, and a central axis thereof may be the axis AX.

The third portion 203 is a waveguide between the first portion 201 and the second portion 202. The third portion 203 extends in a zigzag pattern between the first portion 201 and the second portion 202. The third portion 203 may extend in the zigzag pattern a plurality of times. In the embodiment illustrated in FIG. 1, the third portion 203 extends vertically in the zigzag pattern inward of the radial direction of the second portion 202 in a radial direction. That is, in the third portion 203, as illustrated in FIG. 1, a plurality of waveguides, which have a cylindrical shape and are provided coaxially, are connected in series.

The electromagnetic waves propagating inside the waveguide 20*w* are reflected by the first end 20*a* which is shorted-circuited, thus forming standing waves inside the waveguide 20*w* and inside the plasma generation space 15. When a phase difference of the electromagnetic waves along the waveguide 20*w* between the first end 20*a* and the center of the plasma generation space 15 is $(1+2n)\pi/2$, a resonant state is established in the waveguide and the plasma generation space. Here, n is 0 or a positive integer. At this time, a uniform electric field is applied in the circumferential direction to the plasma generation space 15, resulting in the excitation of a uniform plasma in the circumferential direction. Further, the radial position of the connector 40 is adjusted so that there is zero reflection from the resonator 20 when the resonant state is established. In the case of n=1, as described above, the length of the waveguide 20*w* of the resonator 20 in the plasma processing apparatus 1 (that is, the distance between the first end 20*a* and the second end 20*b* along the waveguide 20*w*) is longer than ½ of the wavelength of the electromagnetic waves in the waveguide 20*w* and is also ¾ or less of that wavelength. Thus, according to the plasma processing apparatus 1, it is possible to significantly change the impedance of the resonator 20 by changing the frequency of the radio-frequency power generated by the radio-frequency power supply 30, compared to that in the case of n=0 (that is, when the length of the waveguide 20*w* is ½ or less of the wavelength of the electromagnetic waves in the waveguide 20*w*). Thus, it becomes possible to perform impedance matching even with a small changeable frequency range of the radio-frequency power supply 30 coupled to the resonator 20. Hence, even with the small changeable frequency range of the radio-frequency power supply 30, it becomes possible to perform impedance matching by adjusting the frequency of radio-frequency power in both the state of plasma generation and the state of no plasma generation in the plasma generation space 15.

Figure 2:
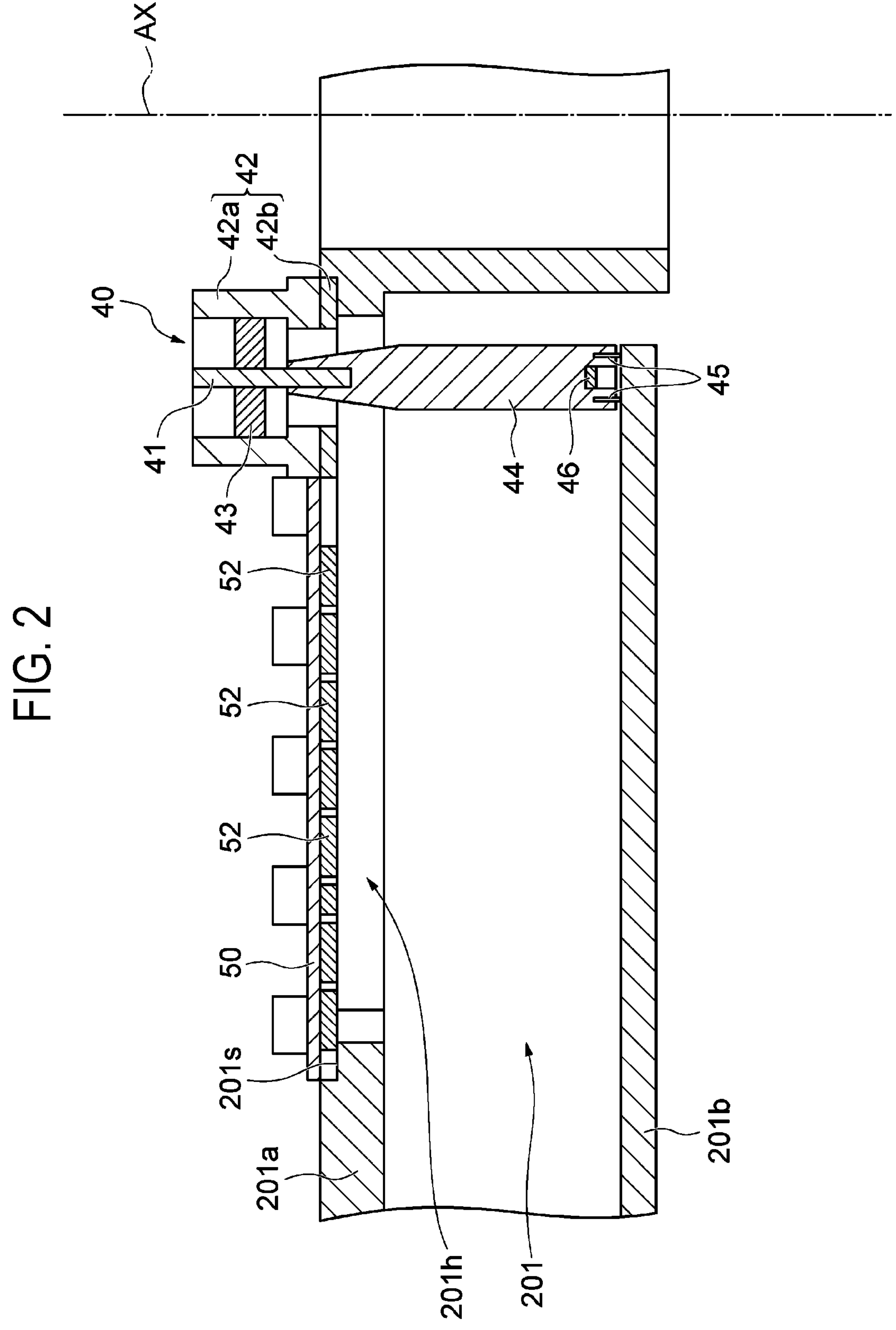
FIG. 2 is a partially enlarged cross-sectional view illustrating a resonator and a connector of the plasma processing apparatus according to one exemplary embodiment.
Figure 3:
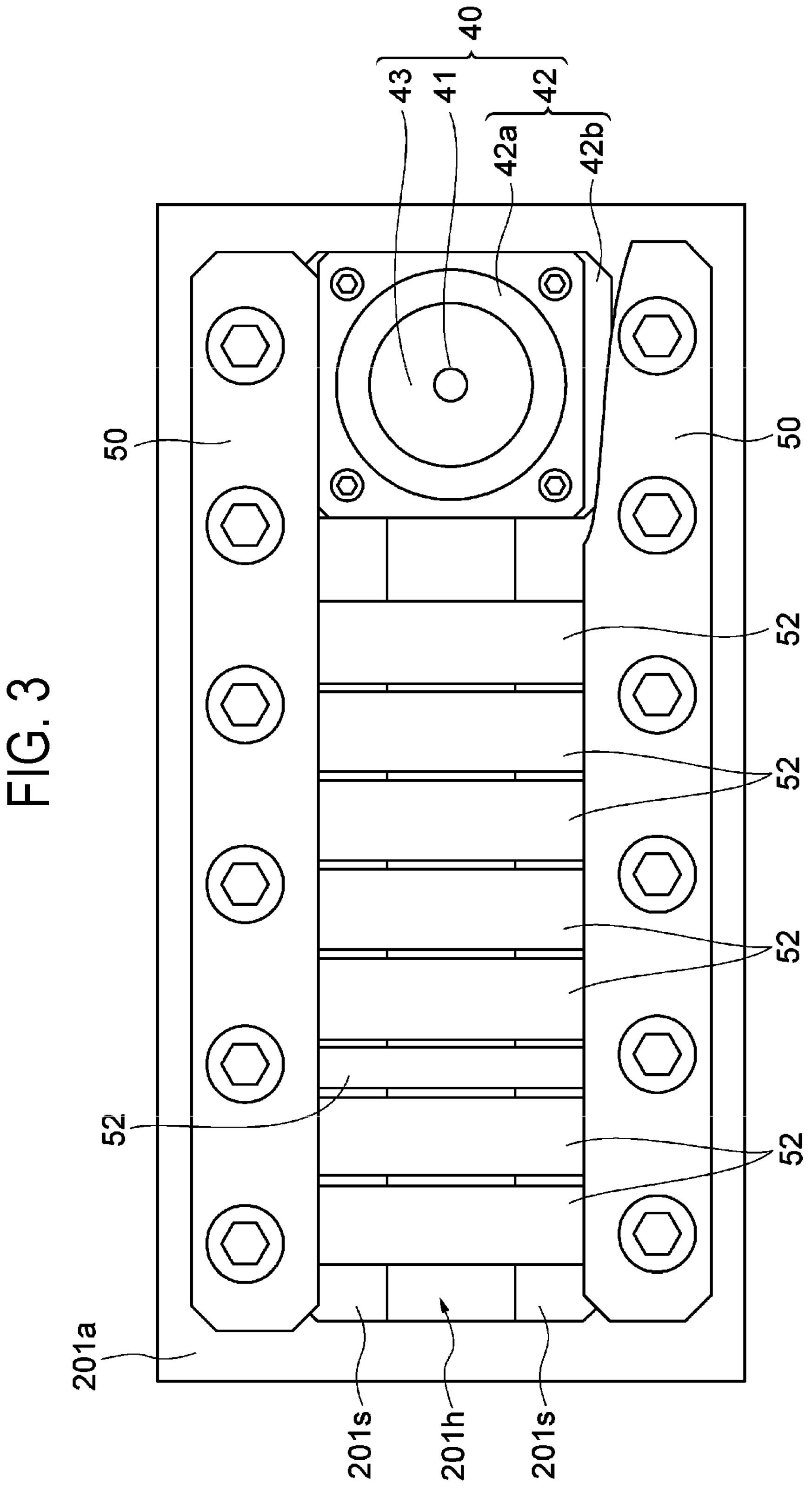
FIG. 3 is a partially enlarged plan view illustrating the resonator and the connector of the plasma processing apparatus according to one exemplary embodiment.

Hereinafter, FIGS. 2 and 3 will be referred together with FIG. 1. FIG. 2 is a partially enlarged cross-sectional view illustrating the resonator and the connector of the plasma processing apparatus according to an exemplary embodiment. FIG. 3 is a partially enlarged plan view illustrating the resonator and the connector of the plasma processing apparatus according to an exemplary embodiment. In FIG. 3, one of a pair of pressing members is illustrated in a partially broken state.

The plasma processing apparatus 1 may further include the connector 40. The connector 40 is coupled to the waveguide 20*w* at the first portion 201 as described above. The connector 40 may be configured to be movable along the radial direction with respect to the axis AX.

In one embodiment, the connector 40 may be a coaxial connector. In this case, the connector 40 may include a central conductor 41, an outer conductor 42, a spacer 43, a coupling rod 44, and one or more contact members 45.

The central conductor 41 has a rod shape. The outer conductor 42 has a cylindrical shape. The central conductor 41 is provided coaxially with the outer conductor 42. The spacer 43 is made of an insulator material such as polytetrafluoroethylene. The spacer 43 is interposed between the central conductor 41 and the outer conductor 42.

A through-hole 201*h* connected to a cavity of the first portion 201 is formed in an upper conductor wall 201*a* of the first portion 201. The through-hole 201*h* extends over a long distance in the radial direction with respect to the axis AX. The upper conductor wall 201*a* provides a support surface 201*s* on either side of the through-hole 201*h*. The support surface 201*s* faces upward.

The coupling rod 44 is coupled to a lower end of the central conductor 41. The coupling rod 44 extends downward through the through-hole 201*h*. One or more contact members 45 are provided at a lower end of the coupling rod 44. The one or more contact members 45 may come into elastic contact with a lower conductor wall 201*b* of the first portion 201. In one embodiment, the connector 40 may incorporate a magnet 46 inside the coupling rod 44 in order to prevent the one or more contact members 45 from being separated from the coupling rod 44.

In one embodiment, the connector 40 may include a plurality of contact probes as the one or more contact members 45. Each of the plurality of contact probes includes a barrel, a spring disposed in an inner bore of the barrel, and a plunger which extends downward from the inner bore of the barrel and is pressed downward by the spring. The plurality of contact probes may be arranged along the circumferential direction around the central axis of the coupling rod 44. Alternatively, the connector 40 may include a spiral spring gasket or an obliquely wound coil spring as the one or more contact members 45.

The outer conductor 42 is in contact with the support surface 201*s*. The outer conductor 42 is movable along the radial direction on the support surface 201*s*. Thus, the connector 40 is capable of adjusting the coupling position with the first portion 201 in the radial direction so as to prevent the reflection of radio-frequency power.

With the set position of the connector 40 in the radial direction, the outer conductor 42 may be sandwiched between the support surface 201*s* and each of a pair of pressing members 50. Each of the pair of pressing members 50 has, for example, a plate shape. The pair of pressing members 50 are secured to the upper conductor wall 201*a* with a plurality of bolts. Further, in order to prevent the leakage of electromagnetic waves from the through-hole 201*h*, one or more covers 52 may be disposed so as to cover the through-hole 201*h*, and may be sandwiched between the support surface 201*s* and each of the pair of pressing members 50.

In one embodiment, the outer conductor 42 may include a first member 42*a* and a second member 42*b*. The first member 42*a* is provided on the second member 42*b* and is secured to the second member 42*b*. The first member 42*a* has a cylindrical shape. The spacer 43 is provided between the first member 42*a* and the central conductor 41. The second member 42*b* has a plate shape and provides a through-hole that is continuous with the inner bore of the first member 42*a*. The second member 42*b* is sandwiched between the support surface 201*s* and each of the pair of pressing members 50.

Figure 4:
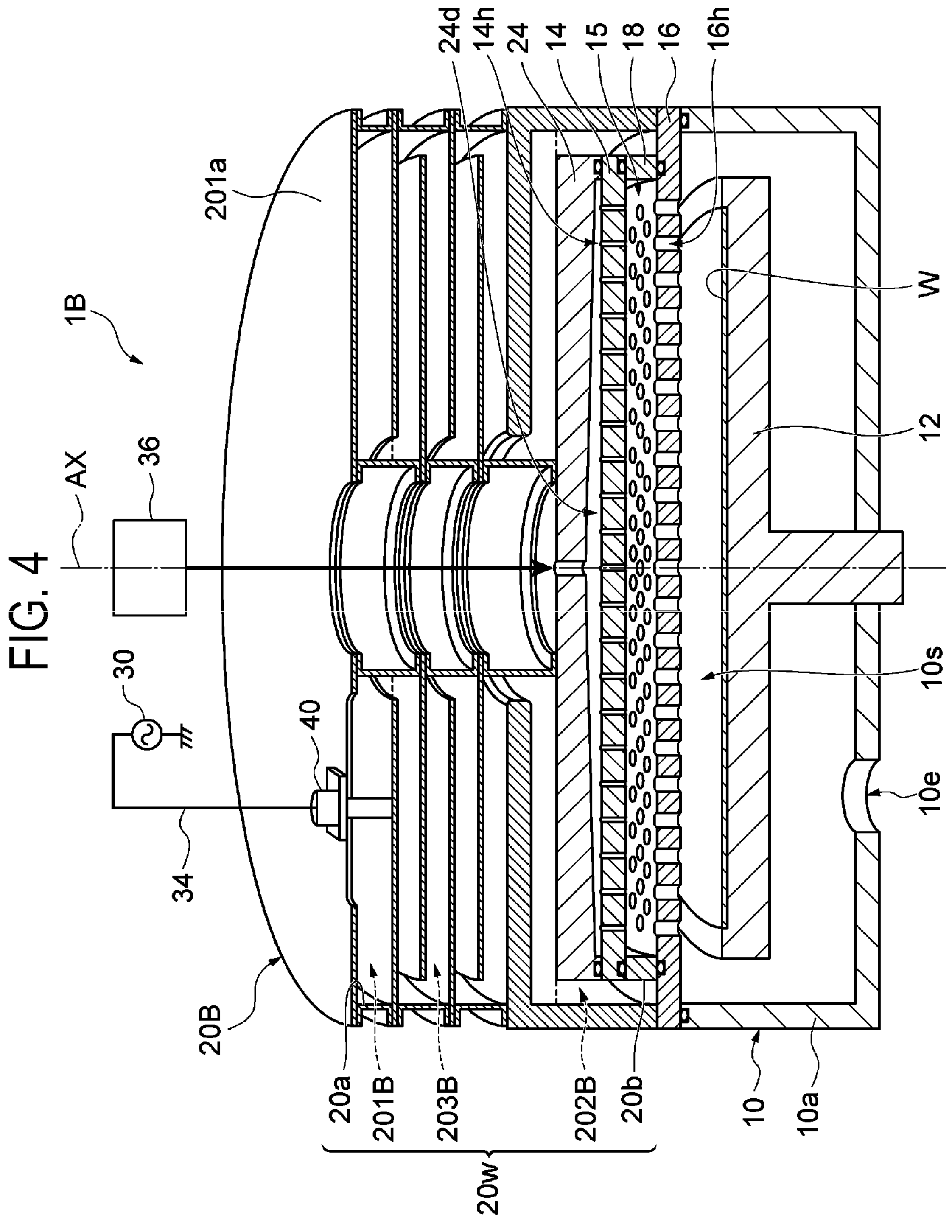
FIG. 4 is a view illustrating a plasma processing apparatus according to another exemplary embodiment.

Hereinafter, a plasma processing apparatus according to another exemplary embodiment will be described with reference to FIG. 4. FIG. 4 is a view illustrating the plasma processing apparatus according to another exemplary embodiment. Hereinafter, a plasma processing apparatus 1B illustrated in FIG. 4 will be described from the viewpoint of differences between the plasma processing apparatus 1 and the plasma processing apparatus 1B.

The plasma processing apparatus 1B includes a resonator 20B instead of the resonator 20. The resonator 20B may be provided above the chamber 10. The waveguide 20*w* of the resonator 20B may provide a cavity surrounded by a wall made of a conductor such as aluminum. The waveguide 20*w* includes a first end 20*a* and a second end 20*b*. The second end 20*b* is an end of a second portion 202B and is coupled to the introducer 18. The first end 20*a* is an end of the waveguide 20*w* opposite to the second end 20*b*. A length (electrical length) of the waveguide 20*w* of the resonator 20B, that is, a length between the first end 20*a* and the second end 20*b* of a path along which electromagnetic waves propagate inside the waveguide 20*w* is longer than ½ of the wavelength of the electromagnetic waves in the waveguide 20*w*. The length of the waveguide 20*w* of the resonator 20B may be ¾ or less of the wavelength of the electromagnetic waves in the waveguide 20*w*.

The waveguide 20*w* of the resonator 20B includes a first portion 201B, the second portion 202B, and a third portion 203B. In FIG. 4, a boundary between the first portion 201B and the third portion 203B and a boundary between the second portion 202B and the third portion 203B are indicated by dotted lines.

The first portion 201B is coupled to the connector 40 in order to introduce the electromagnetic waves into the waveguide 20$w$. The first portion 201B includes the first end 20$a$. The first portion 201B may have a cylindrical shape, and a central axis thereof may be the axis AX. That is, the first portion 201B may extend horizontally from the first end 20$a$ so as to approach the axis AX.

The second portion 202B includes the second end 20$b$ and is coupled to the introducer 18. The second portion 202B extends downward to the second end 20$b$. The second portion 202B may have a cylindrical shape, and a central axis thereof may be the axis AX.

The third portion 203B is a waveguide between the first portion 201B and the second portion 202B. The third portion 203B extends in a zigzag pattern between the first portion 201B and the second portion 202B. The third portion 203B may extend in the zigzag pattern a plurality of times. The third portion 203B extends in the zigzag pattern along a first direction away from the axis AX and a second direction toward the axis AX. That is, in the third portion 203B, a plurality of waveguides, which have a cylindrical shape and are arranged along the vertical direction, are connected in series.

Figure 5:
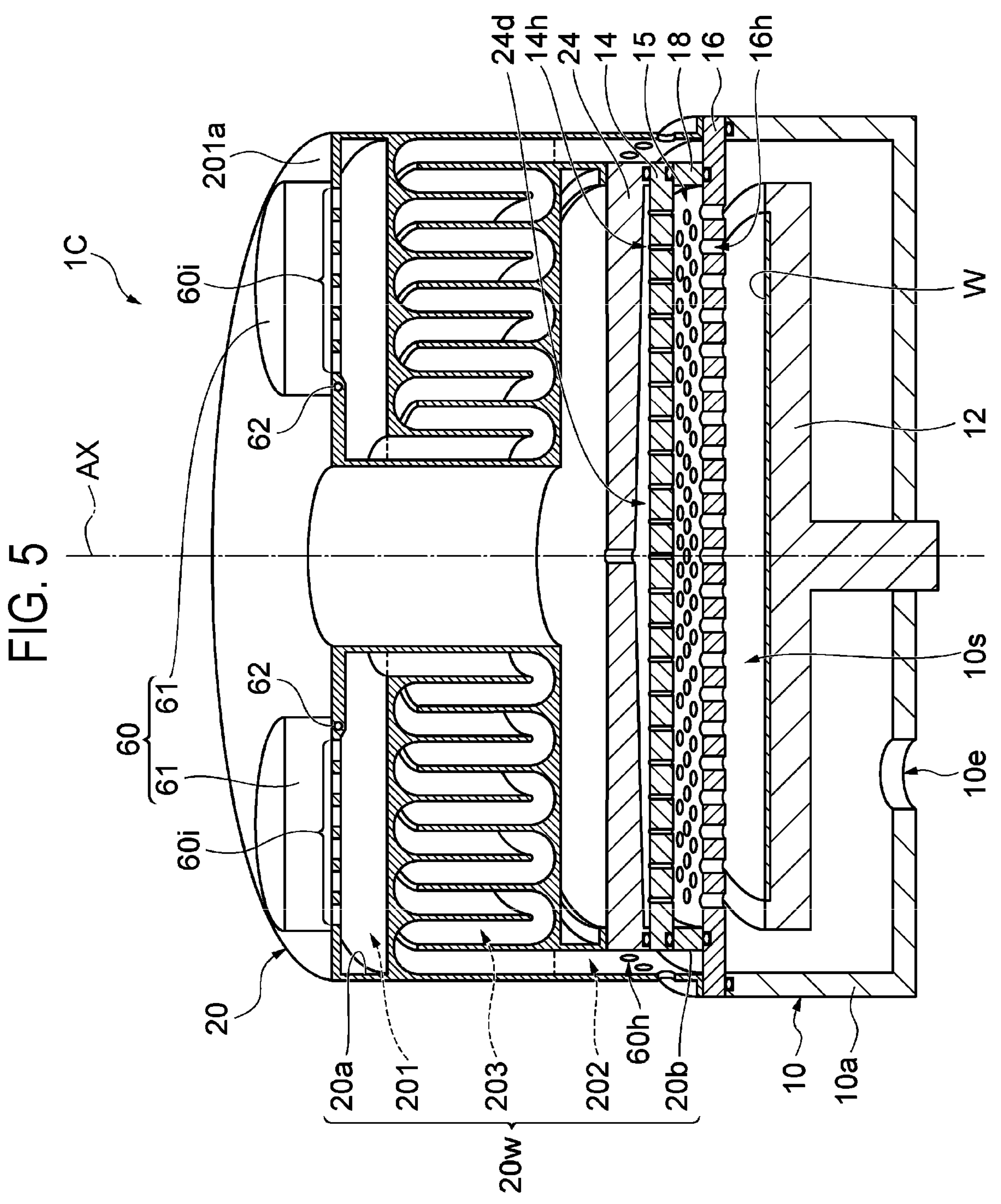
FIG. 5 is a view illustrating a plasma processing apparatus according to still another exemplary embodiment.

Hereinafter, a plasma processing apparatus according to still another exemplary embodiment will be described with reference to FIG. 5. FIG. 5 is a view illustrating the plasma processing apparatus according to still another exemplary embodiment. Hereinafter, a plasma processing apparatus 1C illustrated in FIG. 5 will be described from the viewpoint of differences between the plasma processing apparatus 1 and the plasma processing apparatus 1C.

The plasma processing apparatus 1C further includes a cooler 60. The cooler 60 is configured to cool an upper structure of the chamber 10 including components such as the resonator 20 and the first electrode 14. The cooler 60 may include one or more intake ports 60$h$, one or more exhaust ports 60$i$, and one or more cooling fans 61.

The one or more intake ports 60$h$ communicate the waveguide 20$w$ with the outside of the resonator 20. The one or more intake ports 60$h$ may be formed on an outer conductor wall of the second portion 202. The cooler 60 may include a plurality of intake ports 60$h$. The plurality of intake ports 60$h$ may be arranged along the circumferential direction around the axis AX.

The one or more cooling fans 61 are configured to exhaust the cavity of the waveguide 20$w$ of the resonator 20. The one or more cooling fans 61 may be provided on the upper conductor wall 201$a$ and may exhaust the cavity of the waveguide 20$w$ from the exhaust ports 60$i$ formed in the upper conductor wall 201$a$. In addition, the arrangement of the intake ports and the exhaust ports may be reversed. That is, air may be drawn from the position of the exhaust ports 60$i$ illustrated in FIG. 5 and discharged from the position of the intake ports 60$h$.

The cooler 60 may further include a flow path 62. The flow path 62 may be provided by a pipe. The flow path 62 may be formed in the upper conductor wall 201$a$. A coolant is supplied from a chiller unit to the flow path 62. The coolant circulates between the chiller unit and the flow path 62.

Figure 6:
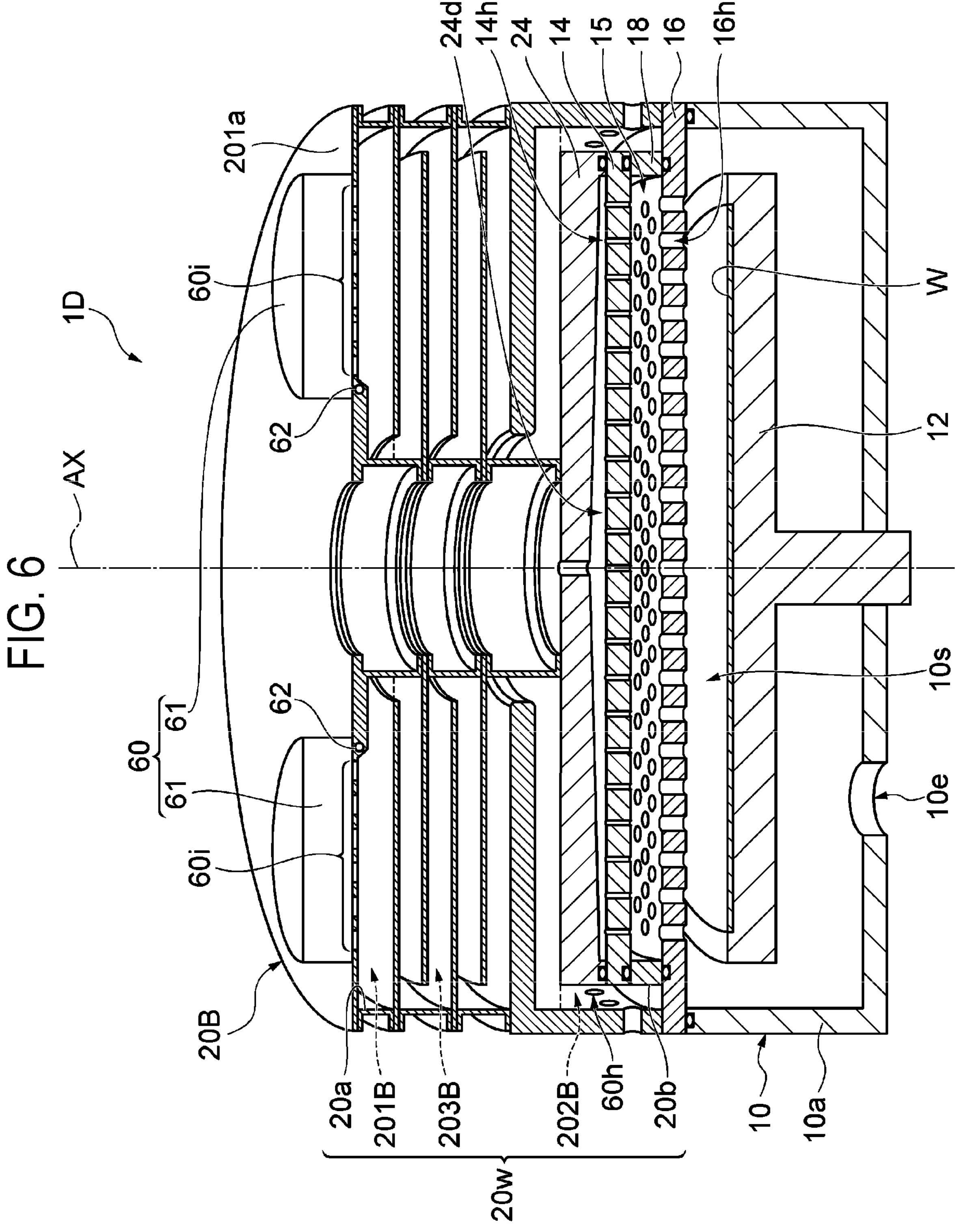
FIG. 6 is a view illustrating a plasma processing apparatus according to yet another exemplary embodiment.

Hereinafter, a plasma processing apparatus according to yet another exemplary embodiment will be described with reference to FIG. 6. FIG. 6 is a view illustrating the plasma processing apparatus according to yet another exemplary embodiment. Hereinafter, a plasma processing apparatus 1D illustrated in FIG. 6 will be described from the viewpoint of differences between the plasma processing apparatus 1B and the plasma processing apparatus 1D.

The plasma processing apparatus 1D further includes the cooler 60 described above. The cooler 60 is configured to cool an upper structure of the chamber 10 including components such as the resonator 20B and the first electrode 14. The one or more intake ports 60$h$ communicate the waveguide 20$w$ with the outside of the resonator 20B. The one or more intake ports 60$h$ may be formed in an outer conductor wall of the second portion 202B. The cooler 60 may include a plurality of intake ports 60$h$. The one or more cooling fans 61 are configured to exhaust the cavity of the waveguide 20$w$ of the resonator 20B.

While various exemplary embodiments have been described above, various additions, omissions, substitutions, and modifications may be made without being limited to the exemplary embodiments described above. Further, elements from different embodiments may be combined to form other embodiments.

Here, various exemplary embodiments included in the present disclosure are described in the following [E1] to [E15].

[E1]

A plasma processing apparatus includes:

a chamber providing a processing space;

a substrate support provided inside the processing space;

a first electrode provided above the processing space;

a second electrode provided above the processing space and below the first electrode, the second electrode providing a plasma generation space between the first electrode and the second electrode and providing a plurality of through-holes to guide an active specie generated in the plasma generation space into the processing space;

an introducer made of a dielectric material and configured to introduce electromagnetic waves into the plasma generation space; and a resonator including a waveguide for propagation of the electromagnetic waves to the introducer, wherein the waveguide has a length longer than ½ of a wavelength of the electromagnetic waves in the waveguide.

[E2]

In the plasma processing apparatus of [E1] above, the length of the waveguide is ¾ or less of the wavelength of the electromagnetic waves in the waveguide.

[E3]

The plasma processing apparatus of [E1] or [E2] above further includes: a radio-frequency power supply electrically coupled to the waveguide and configured to generate radio-frequency power having a variable frequency.

[E4]

In the plasma processing apparatus of [E3] above, the radio-frequency power supply is directly connected to the waveguide using a coaxial line.

[E5]

In the plasma processing apparatus of any one of [E1] to [E4] above, the introducer extends in a circumferential direction around a central axis of the chamber so as to surround the plasma generation space.

[E6]

In the plasma processing apparatus of [E5] above, the introducer has a ring shape.

[E7]

In the plasma processing apparatus of [E5] or [E6] above, the waveguide includes:

a first portion coupled to a connector for introduction of the electromagnetic waves into the waveguide;

a second portion coupled to the introducer; and a third portion provided in a zigzag pattern between the first portion and the second portion.

[E8]

In the plasma processing apparatus of [E7] above, the third portion extends vertically in the zigzag pattern inward of the second portion.

[E9]

In the plasma processing apparatus of [E7] above, the third portion extends in the zigzag pattern along a first direction away from the central axis and a second direction toward the central axis.

[E10]

In the plasma processing apparatus of any one of [E7] to [E9] above, the first portion extends horizontally from an end of the first portion toward the central axis.

[E11]

In the plasma processing apparatus of any one of [E7] to [E10] above, the connector is configured to be movable in a radial direction with respect to the central axis.

[E12]

In the plasma processing apparatus of [E11] above, the connector is a coaxial connector.

[E13]

In the plasma processing apparatus of [E11] or [E12] above, the connector includes a contact probe that is in contact with a conductor wall constituting the first portion.

[E14]

The plasma processing apparatus of any one of [E1] to [E13] above further includes a cooler configured to cool the resonator.

[E15]

In the plasma processing apparatus of [E14] above, the cooler includes:

an intake port through which the waveguide is in communication with an outside of the resonator; and a cooling fan configured to perform exhaust of the waveguide.

According to the present disclosure in some embodiments, it is possible to perform impedance matching even with a small changeable frequency range of a radio-frequency power supply coupled to a resonator of a plasma processing apparatus.

From the foregoing, it will be understood that various exemplary embodiments of the present disclosure have been described herein for purpose of illustration, and that various modifications can be made without departing from the scope and spirit of the present disclosure. Accordingly, the various exemplary embodiments disclosed herein are not intended to be limiting, and the true scope and spirit of the disclosure is indicated by the appended claims.

What is claimed is:

1. A plasma processing apparatus comprising:

a chamber providing a processing space;

a substrate support provided inside the processing space;

a first electrode provided above the processing space;

a second electrode provided above the processing space and below the first electrode, the second electrode providing a plasma generation space between the first electrode and the second electrode and providing a plurality of through-holes to guide active species generated in the plasma generation space into the processing space;

an introducer made of a dielectric material and provided between the first electrode and the second electrode to introduce electromagnetic waves into the plasma generation space; and a resonator including a waveguide for propagation of the electromagnetic waves to the introducer, wherein the waveguide has a length longer than ½ of a wavelength of the electromagnetic waves in the waveguide; and wherein the electromagnetic waves are radio-frequency waves including VHF waves or UHF waves.

2. The plasma processing apparatus of claim 1, wherein the length of the waveguide is ¾ or less of the wavelength of the electromagnetic waves in the waveguide.

3. The plasma processing apparatus of claim 1, further comprising: a radio-frequency power supply electrically coupled to the waveguide and configured to generate radio-frequency power having a variable frequency.

4. The plasma processing apparatus of claim 3, wherein the radio-frequency power supply is directly connected to the waveguide using a coaxial line.

5. The plasma processing apparatus of claim 1, wherein the introducer extends in a circumferential direction around a central axis of the chamber so as to surround the plasma generation space.

6. The plasma processing apparatus of claim 5, wherein the introducer has a ring shape.

7. The plasma processing apparatus of claim 5, wherein the waveguide includes a first portion coupled to a connector for introduction of the electromagnetic waves into the waveguide;

a second portion coupled to the introducer; and a third portion provided in a zigzag pattern between the first portion and the second portion.

8. The plasma processing apparatus of claim 7, wherein the third portion extends vertically in the zigzag pattern inward of the second portion.

9. The plasma processing apparatus of claim 7, wherein the third portion extends in the zigzag pattern along a first direction away from the central axis and a second direction toward the central axis.

10. The plasma processing apparatus of claim 9, further comprising a cooler configured to cool the resonator.

11. The plasma processing apparatus of claim 10, wherein the cooler includes:

an intake port through which the waveguide is in communication with an outside of the resonator; and a cooling fan configured to perform exhaust of the waveguide.

12. The plasma processing apparatus of claim 9, wherein the first portion extends horizontally from an end of the first portion toward the central axis.

13. The plasma processing apparatus of claim 9, wherein the connector is configured to be movable in a radial direction with respect to the central axis.

14. The plasma processing apparatus of claim 7, wherein the first portion extends horizontally from an end of the first portion toward the central axis.

15. The plasma processing apparatus of claim 7, wherein the connector is configured to be movable in a radial direction with respect to the central axis.

16. The plasma processing apparatus of claim 15, wherein the connector is a coaxial connector.

17. The plasma processing apparatus of claim 15, wherein the connector includes a contact probe that is in contact with a conductor wall constituting the first portion.

18. The plasma processing apparatus of claim 1, further comprising a cooler configured to cool the resonator.

* * * * *